United States Patent [19]
Hawkins, Jr.

[11] Patent Number: 5,987,089
[45] Date of Patent: Nov. 16, 1999

[54] PROGRAMMABLE DIVIDER WITH CONTROLLED DUTY CYCLE

[75] Inventor: Max S. Hawkins, Jr., Cedar Rapids, Iowa

[73] Assignee: Rockwell Science Center, Inc., Thousand Oaks, Calif.

[21] Appl. No.: 08/905,893

[22] Filed: Aug. 4, 1997

[51] Int. Cl.⁶ .................................................. H03K 21/00
[52] U.S. Cl. ................................................................ 377/47
[58] Field of Search ................................................. 377/47

[56] References Cited

U.S. PATENT DOCUMENTS 5,077,686  12/1991  Rubinstein ................................. 377/47
5,127,036  6/1992  Pham ......................................... 377/47
5,526,391  6/1996  Shankar et al. ........................... 377/47

*Primary Examiner*—Margaret Rose Wambach
*Attorney, Agent, or Firm*—Kyle Eppele; James P. O'Shaughnessy

[57] ABSTRACT

A programmable divider or prescaler divides an input signal by a divisor of two raised to the $m^{th}$-power plus one, $(2^m+1)$, where m is an integer, and n is a value between zero and two raised to the $m^{th}$-power minus one, $(2^m-1)$. When m is equal to 3, the duty cycle is between 44% and 56%. The divider can be utilized in communication applications for providing radio frequency source signals. The duty cycle is maintained around 50% for use with balanced mixers.

21 Claims, 9 Drawing Sheets

PROGRAMMABLE DIVIDER WITH CONTROLLED DUTY CYCLE

FIELD OF THE INVENTION

The present invention relates to programmable dividers for use in communication applications. More particularly, the present invention relates to a programmable divider which has a duty cycle optimized to be close to 50 percent.

BACKGROUND OF THE INVENTION

Radios, wireless devices, and other high frequency applications often require several sources of ultra-high frequency (UHF), very-high frequency (VHF), radio frequency (RF) or other high frequency signals. Programmable dividers can be utilized to generate frequency signals at various frequencies. The programmable divider or programmable prescaler typically receives a divisor at a selection input and an input signal at a clock input. The divider provides an output signal (generally a square wave) which has a frequency equal to the frequency of the input signal divided by the divisor.

Heretofore, programmable dividers have produced output signals which have variable duty cycles (e.g., the ratio of on-time to off-time). The variable duty cycle is often a function of the divisor provided at the selection input. For example, U.S. Pat. No. 4,575,867 discloses a programmable divider or prescaler which can divide the frequency of an input signal by a factor of ($2^m$+n), where m is an integer and n is a whole number from zero to ($2^m$−1). The divider can provide output signals having a duty cycle approaching 50% for some values of the divisor. However when other values are utilized, duty cycles more than 33% away from 50% are produced (e.g., for m=3 and n=7, 4 positive pulses and 11 negative pulses results in a duty cycle of 4/15 or 26%).

When a programmable divider is utilized to provide an injection signal to balanced mixers, mixer performance is degraded if the duty cycle is significantly greater than or less than 50%. A mixer has improved spurious performance when provided with a signal having a duty cycle close to 50%.

Thus, there is a need for a programmable divider or prescaler which can provide a duty cycle that approaches 50% for all values of its divisor. Further still, there is a need for a programmable divider which can divide the frequency of a signal by a significant number of divisors and yet provide a duty cycle approaching 50% for all values of the divisors. Even further still, there is a need for a programmable divider which provides an output signal having an approximately 50% duty cycle which is not limited by critical path delays.

SUMMARY OF THE INVENTION

The present invention relates to a programmable divider for communication applications. The divider is programmable to divide an input frequency of an input signal by ($2^m$+n), where m is a whole number or an integer greater than or equal to two and n is an integer from zero to ($2^m$−1). The programmable divider includes a selection input, an array of counters configured to receive the input signal and to provide an output signal, and a control circuit. The control circuit is coupled to the array of counters and to the input. The control circuit receives a selection signal at the input. The selection signal is indicative of n. The control circuit cooperates with the array so the array provides the output signal at an output frequency equal to the input frequency of the input signal divided by ($2^m$+n). The output signal has a duty cycle between 39% and 61% for all values of m and n.

The present invention further relates to a programmable divider including a selection input for receiving a value of n, a first counter circuit, and a second counter circuit. The first counter circuit is configured to receive the input signal and to provide an output signal. The first counter circuit includes m counters, each having an output. The second counter circuit is configured to selectively and temporarily disable a transition of at least one output of the m counters in response to the value of n. The first counter circuit provides the output signal at an output frequency equal to the input frequency of the input signal divided by ($2^m$+n), where m is an integer greater than or equal to two and n is an integer from zero to ($2^m$−1). The output signal has a duty cycle between 39% and 61% all for values of m and n.

The present invention still further relates to a programmable prescaler responsive to a value n. The programmable prescaler divides an input frequency of an input signal by ($2^m$+n), where m is an integer greater than or equal to two and n is an integer from zero to ($2^m$−1) The programmable prescaler includes a first means for receiving the input signal and for providing an output signal at an output frequency equal to the input frequency of the input signal divided by ($2^m$+n), and a second means for receiving the value n. The second means cooperates with the first means to cause the output signal to have an output frequency equal to the input frequency of the input signal divided by ($2^m$+n) and to cause the output signal to have a duty cycle between 39% and 61% for all values of m and n (m≧2, n=$2^m$−1).

In one aspect of the present invention, a programmable divider or prescaler can be utilized in communication applications and in mixing applications. The prescaler provides an output signal which has a frequency of the input signal divided by a factor of ($2^m$+n). Counts are distributed between halves of the output signal as evenly as possible so even counts have a 50% duty cycle and odd counts have a duty cycle within plus or minus one count of 50%. Therefore, at minimal values for m and n where ($2^m$+n) is an odd number, the duty cycle would be either 60% or 40% (three counts positive and two counts negative or three counts negative and two counts positive). Preferably, m is three and the duty cycle is between 56% and 44% for odd values of n ($2^3$+1=9, 4+5).

According to another aspect of the present invention, one set of cascaded two or three count dividers are used to generate counts. A second of two or three count dividers are used to generate a +1, +2, and a +4 count. Odd counts are obtained by logically oring the +1 count with the +2 and +4 count.

In yet another aspect of the present invention, a high speed programmable prescaler is highly integratable and is integrated on a silicon-on-sapphire, gallium arsenide, silicon, or other substrate. The divider is preferably useable in balanced mixing applications.

BRIEF DESCRIPTION OF THE DRAWINGS

The present invention will hereinafter be describe wherein like numerals denote like elements, and.

DETAILED DESCRIPTION OF THE PREFERRED EXEMPLARY EMBODIMENTS

Figure 1:
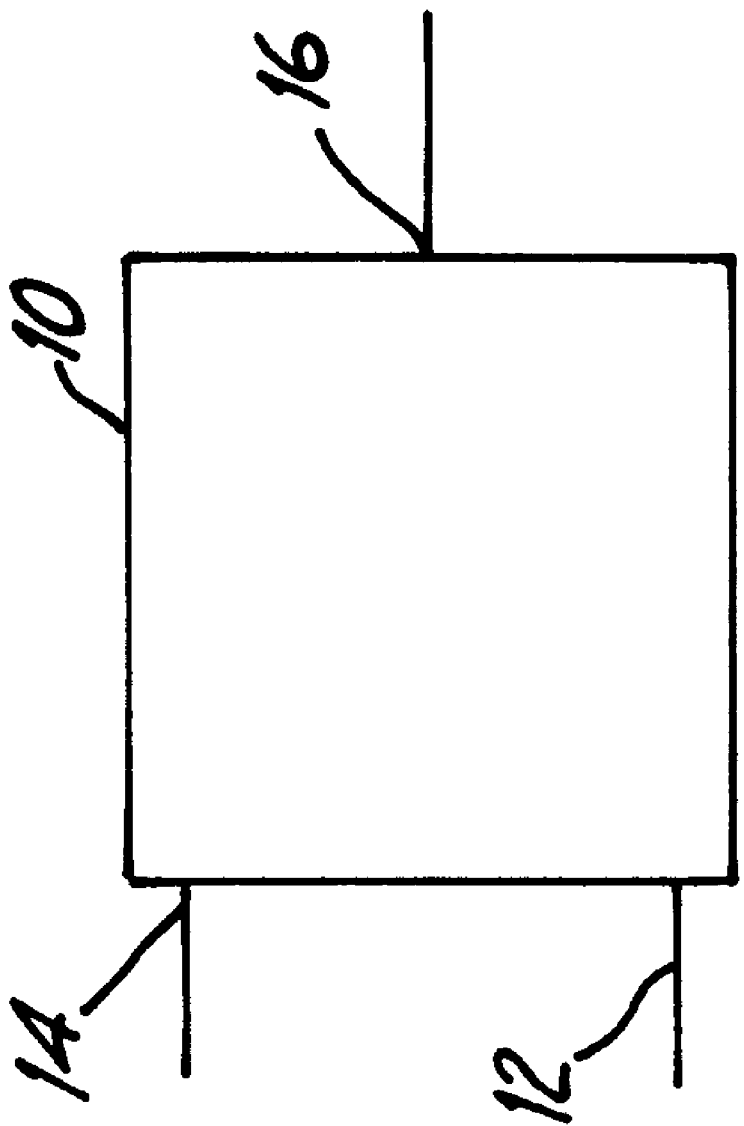
FIG. 1 is a block diagram of a programmable divider in accordance with an exemplary embodiment of the present invention.

With reference to FIG. 1, a block diagram of a high speed prescaler or programmable divider 10 is shown for use in a wireless device, radio, or other frequency synthesizer application. Preferably, divider 10 can be utilized in a radio transceiver to produce synthesized frequencies for mixer applications.

Divider 10 receives a frequency source signal at an input 12. Frequency source signals can be generated by a local oscillator, a divider or a voltage-controlled oscillator (VCO). Alternatively, other devices for providing a high frequency signal can be utilized such as a direct digital synthesizer or any non-rotating device for producing alternating current. The frequency source signal can be a square wave or an analog signal having a frequency up 8 GigaHertz (GHz). However, any frequency range can be utilized.

Divider 10 divides the frequency of the frequency source signal by ($2^m$+n) where m is an integer and n is a whole number from zero to ($2^m$−n). Preferably, a value for n is provided at an input 14 and m is greater than or equal to two. Input 14 can be a number of inputs $n_1, n_2, \ldots n_k$, which can be coupled to a plurality of switches, a dial or other logic for providing a binary representation of n. Divider 10 divides the frequency of the frequency source signal by ($2^m$+n) and provides an output signal at the divided frequency output 16.

The output signal is preferably a square wave having a frequency up to 1.0 Ghz and a duty cycle close to 50%. The output signal can be within other frequency ranges. The duty cycle is 50% for even values of ($2^m$+n). The duty cycle is one count from a 50% duty cycle for odd values of ($2^m$+n). For m=3 and n=1 (e.g., divisor equals 9), the duty cycle is between 44% and 56% (e.g., 4 counts logic high, 5 counts logic low). For m=3 and n=7, the duty cycle is between 47% to 53%. Thus, for m=3 and odd values of n, the duty cycle of the output signal is between 44% and 56%. For m=2, the duty cycle is between 60% and 40% for odd values of n (e.g., 3 counts logic high, 2 counts logic low).

Figure 2:
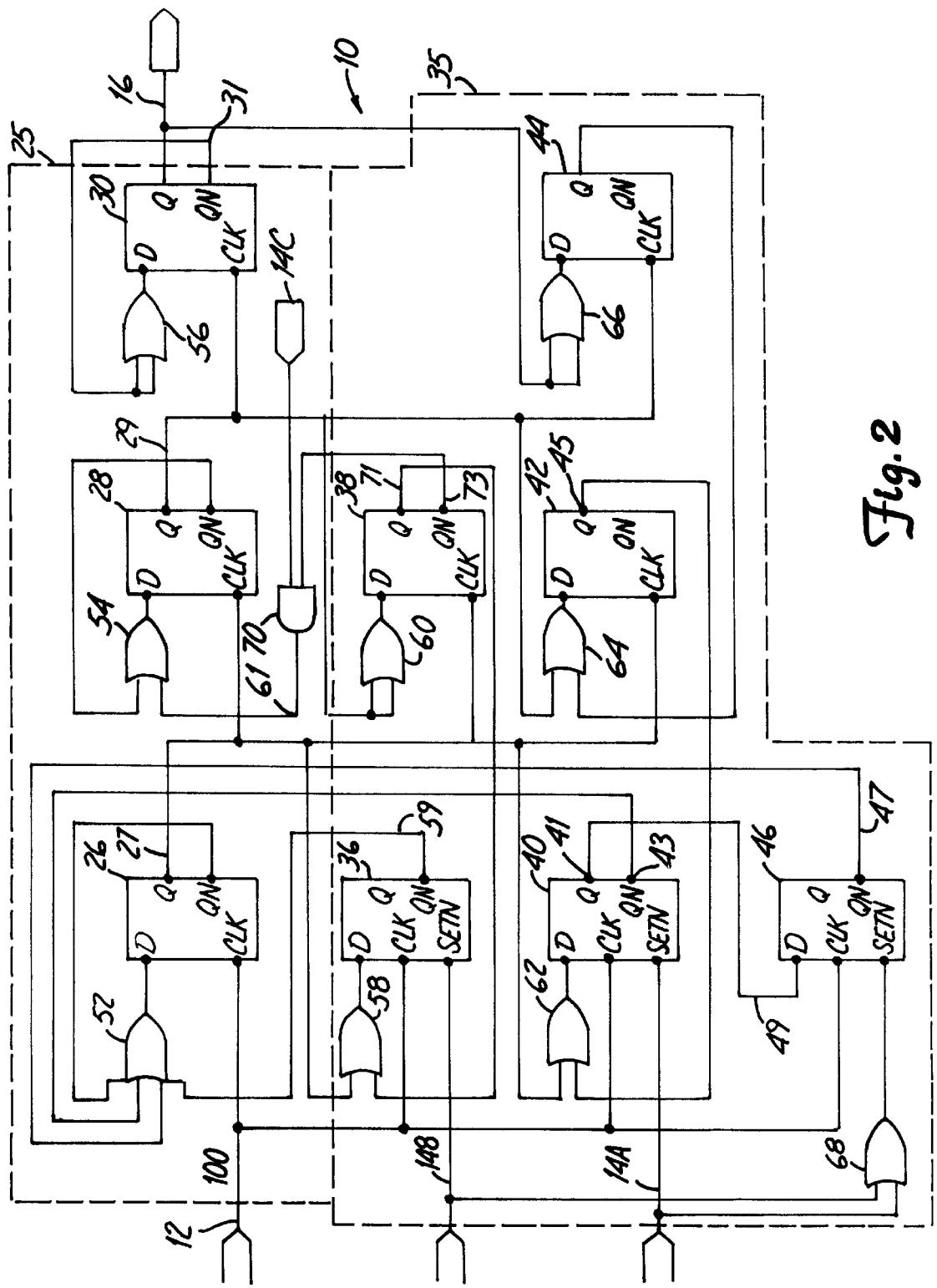
FIG. 2 is a more detailed electrical schematic diagram of the programmable divider illustrated in FIG. 1 configured as a ($2^m$+n) divider wherein m=3.

With reference to FIG. 2, divider 10 is configured or arranged to have the value m set to 3. Therefore, divider 10 in FIG. 2 is an (8+n) divider where n is an integer from zero to seven. Divider 10 includes an array 25 of counters 26, 28, and 30. Divider 10 also includes an array 35 of counters 36, 38, 40, 42, 44, and 46. Additionally, divider 10 includes logic gates 52, 54, 56, 58, 60, 62, 64, 66, 68, and 70 which provide various control information so divider 10 appropriately divides the frequency source signal at input 12 and provides an almost 50% duty cycle output signal at output 16.

Array 25 and gates 52, 54 and 56 are arranged to divide the frequency of input signal by eight assuming the value of n at input 14A, 14B and 14C is zero. Input 14 (FIG. 1) is shown as three separate logic inputs 14A, 14B and 14C in FIG. 2, which receive a binary representation of value of n where input 14A receives the one's place, input 14B receives the 2's place and input 14C relives the 4's place.

Array 25 and 35 cooperate to appropriately divide the frequency of the frequency source signal at input 12 by (8+n). The signals provided on inputs 14A, 14B and 14C cause counters 36, 38, 40, 42, 44 and 46 in array 35 and gates 52, 54, 56, 58, 60, 62, 64, 66, 68 and 70 to disable transitions of counters 26 and 28 in array 25 so the appropriate waveform is formed at output 16. Thus, array 35 and gates 52, 54, 56, 58, 60, 62, 64, 66, 68 and 70 cooperate as a control circuit to cause array 25 to appropriately frequency divide the frequency source signal.

Dividers or counters 26, 28, 30, 36, 38, 40, 42, 44, and 46 are preferably D-type flip-flops having a clock input, a data input, a data output, and an inverse data output. Alternatively, counters 26, 28, 30, 36, 38, 40, 42, 44, and 46 can be any type of data latch. Counters 36, 40 and 46 also include an inverse set input. Counters 26, 28, 30, 36, 38, 40, 42, 44 and 46 are interconnected with logic gates 52, 54, 56, 58, 60, 62, 64, 66, 68 and 70 as shown in FIG. 2 to provide the appropriate dividing operation. Preferably, gates 52, 54, 56, 58, 60, 62, 64 and 66 are OR gates, and gates 68 and 70 are AND gates. The operation of the individual components in FIG. 2 such as counters 26, 28, 30, 36, 38, 40, 42, 44 and 46 and gates 52, 54, 56, 58, 60, 62, 64, 68 and 70 are well known in the art. Other types of dividing elements can replace counters 26, 28, 30, 36, 38, 40, 42, 44 and 46.

With reference to FIG. 2, the operation of divider 10 is discussed below when n=0. When n=0, the inputs at 14A, 14B and 14C are all logic low and counters 36, 38, 40, 42, 44 and 46 can only provide logic lows to gates 52 and 54. The logic low on inputs 14A and 14B is coupled to set input on counters 36, 40, and 46 and causes counters 36, 40 and 46 to provide a logic low to gate 52 thereby not affecting the operation of array 25. Similarly, gate 70 receives a logic low from input 14C and provides a logic low to gate 54, thereby preventing counter 38 from affecting the operation of counter 28 in array 25.

When n=0, counter 26 divides the frequency of the frequency source signal at input 12 (the clock signal 100 in FIGS. 3A–G) by two. Counter 28 divides the frequency of the signal provided on line 27 by counter 26 (signal 104 in FIGS. 3A–G) by two. Counter 30 divides the frequency of the signal provided on line 29 by counter 28 (signal 106 in FIGS. 3A–G) by two to ultimately divide the frequency of the frequency source signal by eight ($\frac{1}{2} \times \frac{1}{2} \times \frac{1}{2} = \frac{1}{8}$). Thus, array 25 implements a divide by eight operation for divider 10 when n=0. The output signal (signal 102 in FIGS. 3A–G) is provided at output 16 by counter 30.

With reference to FIGS. 2 and 3A–G, the operation of divider 10 is described for values of n from 1 to 7 with reference to timing diagrams in FIGS. 3A–G for each value of n. In FIGS. 3A–G, the input signal provided at input 12 is clock signal 100. The output of counter 26 at line 27 is signal 104. The output of counter 28 at line 29 is signal 106. The output of counter 30 at output 16 is signal 102. Alternatively, an inverted output signal can be provided by an invertor coupled to counter 30. The signal at line 59 from counter 36 is signal 112. The signal at line 61 from gate 70 is signal 114. The signal at line 47 from counter 46 is signal 116. The signal from line 43 of counter 40 is signal 118.

Figure 3A:
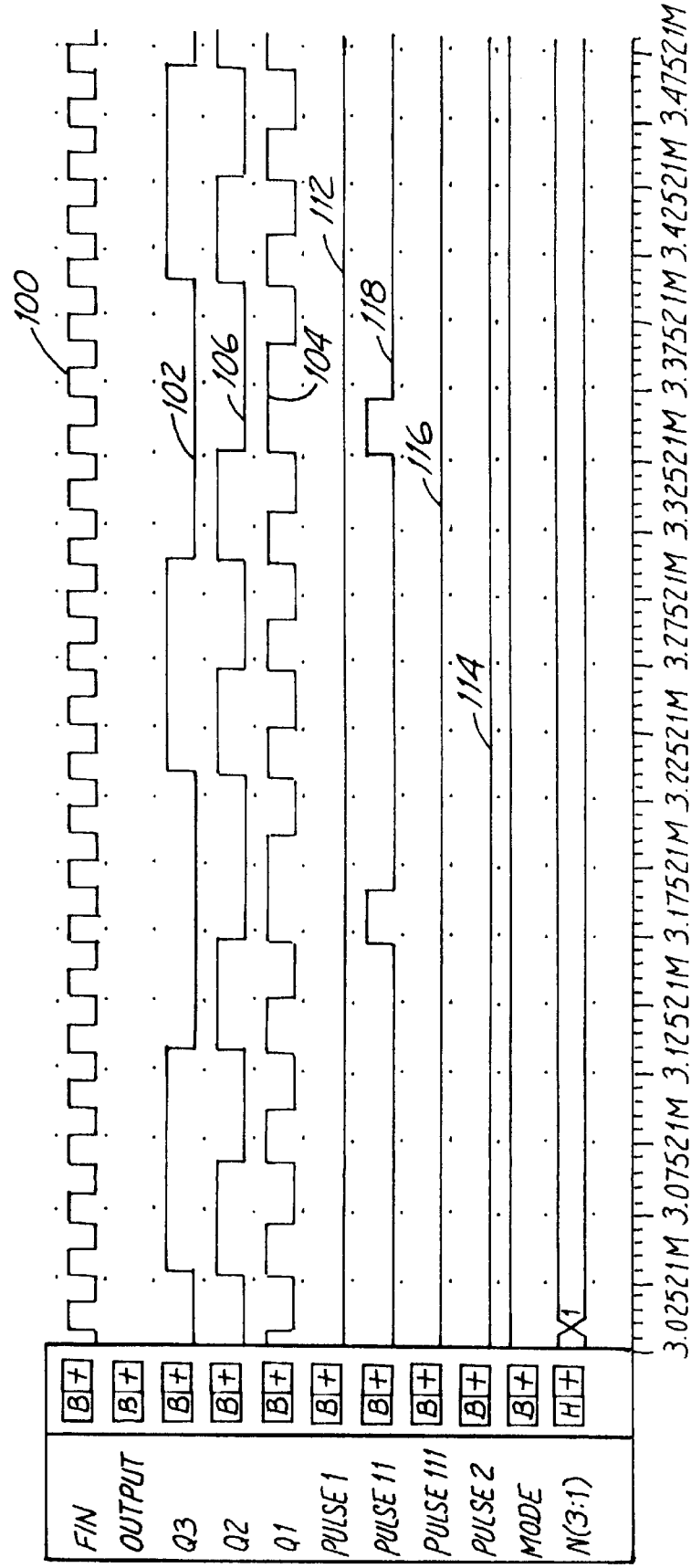
FIGS. 3A–G are timing diagrams illustrating the operation of the programmable divider illustrated in FIG. 2 for values of n=1 to 7.

In FIG. 3A, the value of n is one; a logic high is provided at input 14A and logic lows are provided at inputs 14B and 14C. The binary representation of n is 001. Therefore, divider 10 divides signal 100 by nine (e.g., 8+1). The logic low at input 14C disables signal 114 from gate 70 on line 61, (e.g., signal 114 is a constant logic low so the operation of counter 28 is not affected by signal 114). Similarly, when input 14B is a logic low, signal 112 and signal 116 remain logic low by operation of the inverse set input on counters 36 and 46. Gate 68 provides the logic low to the inverse set input of counter 46 in response to the logic low on input 14B.

A logic high at input 14A causes a pulse to be developed on signal 118 on every fourth rising edge of signal 104. The pulse is generated every fourth rising edge of signal 104 by operation of counters 40, 42 and 44 and of gates 62 and 64. Counter 44 disables counter 42 for one-half period of signal 102. In the other half period of signal 102, pulse 118 is formed on every two rising edges of signal 104.

The pulse on signal 118 delays the next rising edge of signal 104 for one cycle of signal 100 (called a "clock" below). Therefore, every four transition of signal 104 includes a one-clock delay. The pulse on signal 118 disables the transition of signal 104 from a logic high to a logic low for one clock by providing a logic high at gate 52. Accordingly, output signal 102 remains a logic low for one extra clock and then changes to a logic high for four clocks. Therefore, the duty cycle of signal 102 is between 44% and 56% when n=1.

Figure 3B:
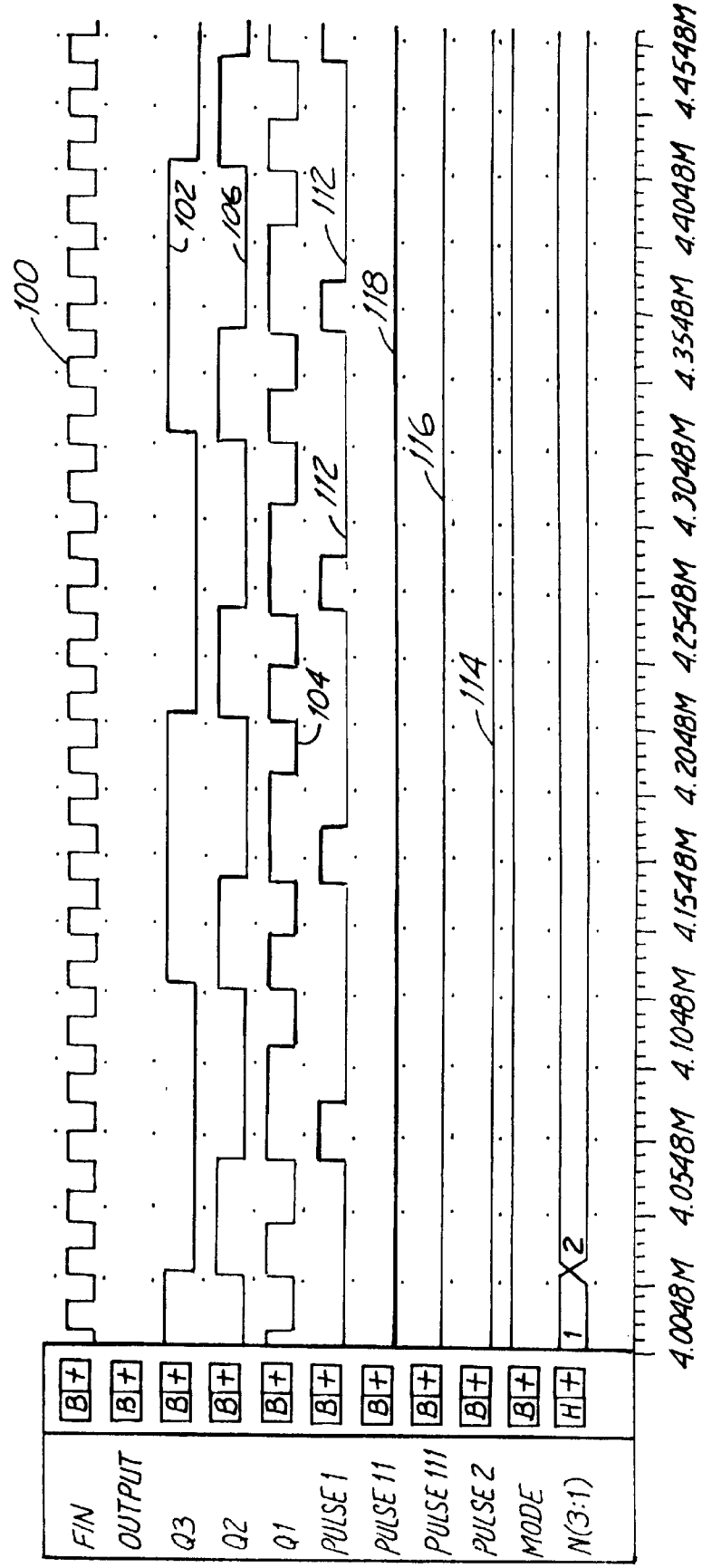

With reference to FIG. 3B, the value of n is 2, a logic high is provided at input 14B, and logic lows are provided on inputs 14A and 14C. When a logic low is provided on input 14A, signals 116 and 118 remain a logic low due to the operation of the inverse set input of counters 40 and 46. Signal 114 remains a logic low because input 14C is a logic low.

Signal 112 at line 59 provides a pulse on every two rising edges of signal 104. The pulse on signal 118 is generated by counter 36 in response to signal 104 on line 27 and a signal (not shown) on a line 71 from counter 38. Each pulse delays the transition of signal 118 for one clock. Therefore, a clock delay is added every two cycles of signal 104. The pulse in signal 104 disables the transition of signal 104 by providing a logic high at gate 52. Therefore, signal 102 is a logic low for five clock cycles and a logic high for five clock cycles and has a duty cycle of 50%.

Figure 3C:
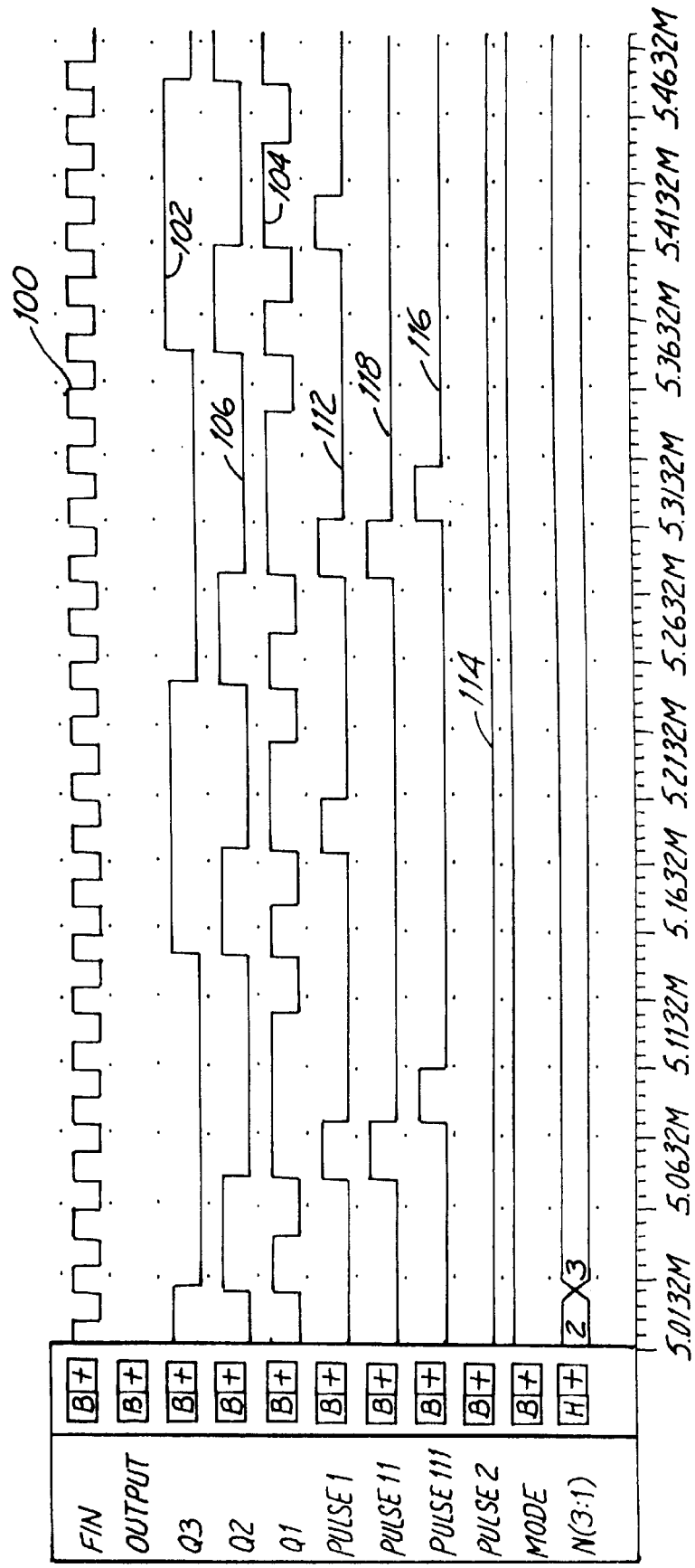

In FIG. 3C, the value of n is 3; a logic high is provided at inputs 14A and 14B. When n=3, signal 112 has a pulse on every two rising edges of signal 104 as discussed with reference to FIG. 3B. Signal 118 has a pulse on every two rising edges of signal 104 only during one-half period of signal 102, as discussed with reference to FIG. 3A. The pulse of signal 118 is coincident with every other pulse of signal 112.

Signal 116 has a positive pulse on every trailing edge of signal 118. Counter 46 generates signal 116 at line 47 in response to the inverse of signal 118 (the signal 41) and in response to clock signal 100. Thus, the pulse of signal 116 is delayed from the pulse of signal 118 by one clock.

Signals 112, 116, and 118 are provided through gate 52 and operate to disable counter 26 from transitioning signal 104 from a logic high to a logic low for three-clocks every four rising edges of signal 104. The combination of signals 112, 116 and 118 causes a three-clock delay in the transition from a logic low to a logic high in signal 118 every two rising edges of signal 104. Therefore, signal 102 is a logic high for five clocks and a logic low for six clocks and has a duty cycle between 45% and 55%.

Figure 3D:
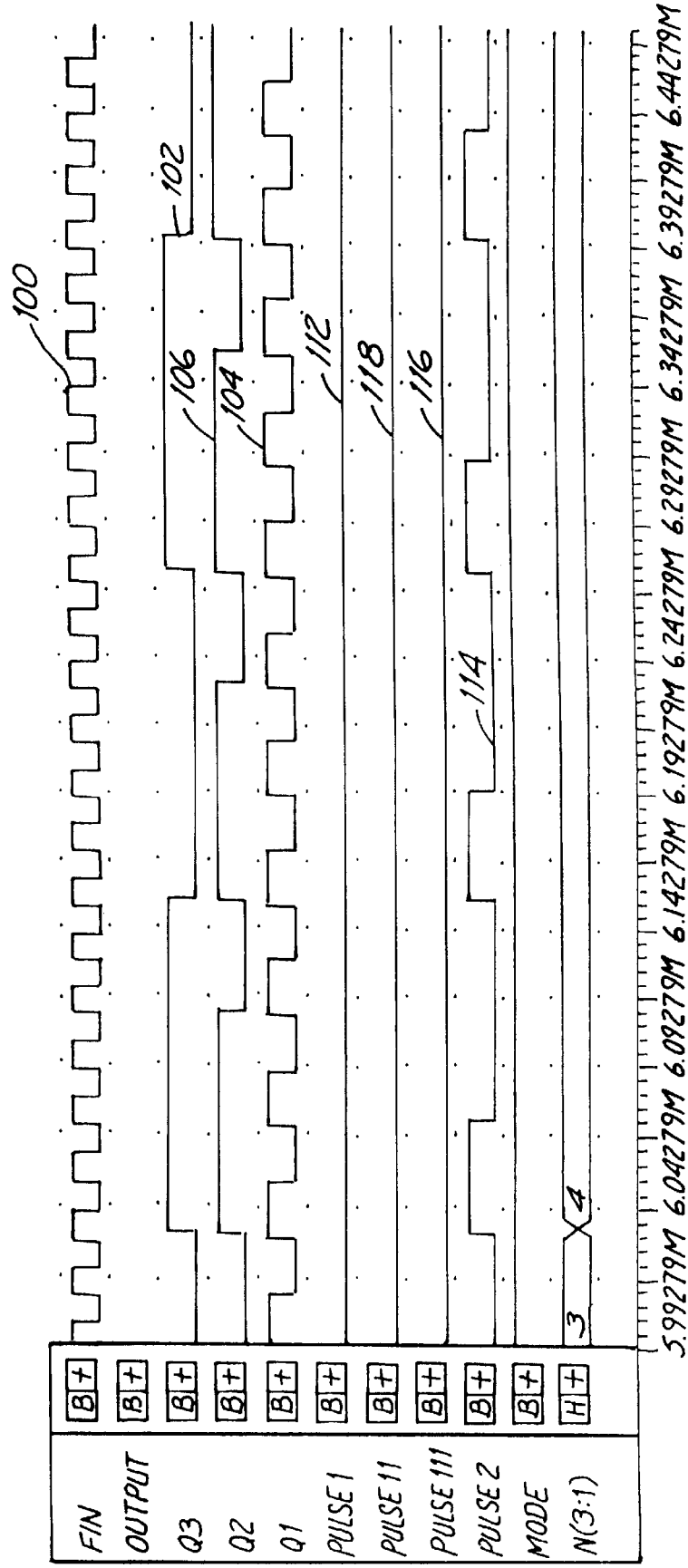

In FIG. 3D, the value of n is 4; a logic high is provided at input 14C. Signals 112, 116 and 118 are maintained at a logic low by the inverse set inputs on counters 36, 40 and 46. Signal 114 has a pulse on every rising edge of signal 106. The pulse is two-clocks wide. Counter 38 provides a two-clock wide pulse on line 73 in response to signal 104. The pulse from line 37 is provided through gate 70 to gate 54 on line 61. Signal 114 disables the transition from a logic high to a logic low of signal 106 for two-clocks every rising edge of signal 106 thereby delaying every transition of signal 102 for two-clocks. Accordingly, signal 102 is a logic high for six clocks and a logic low for six clocks and has a 50% duty cycle.

Figure 3E:
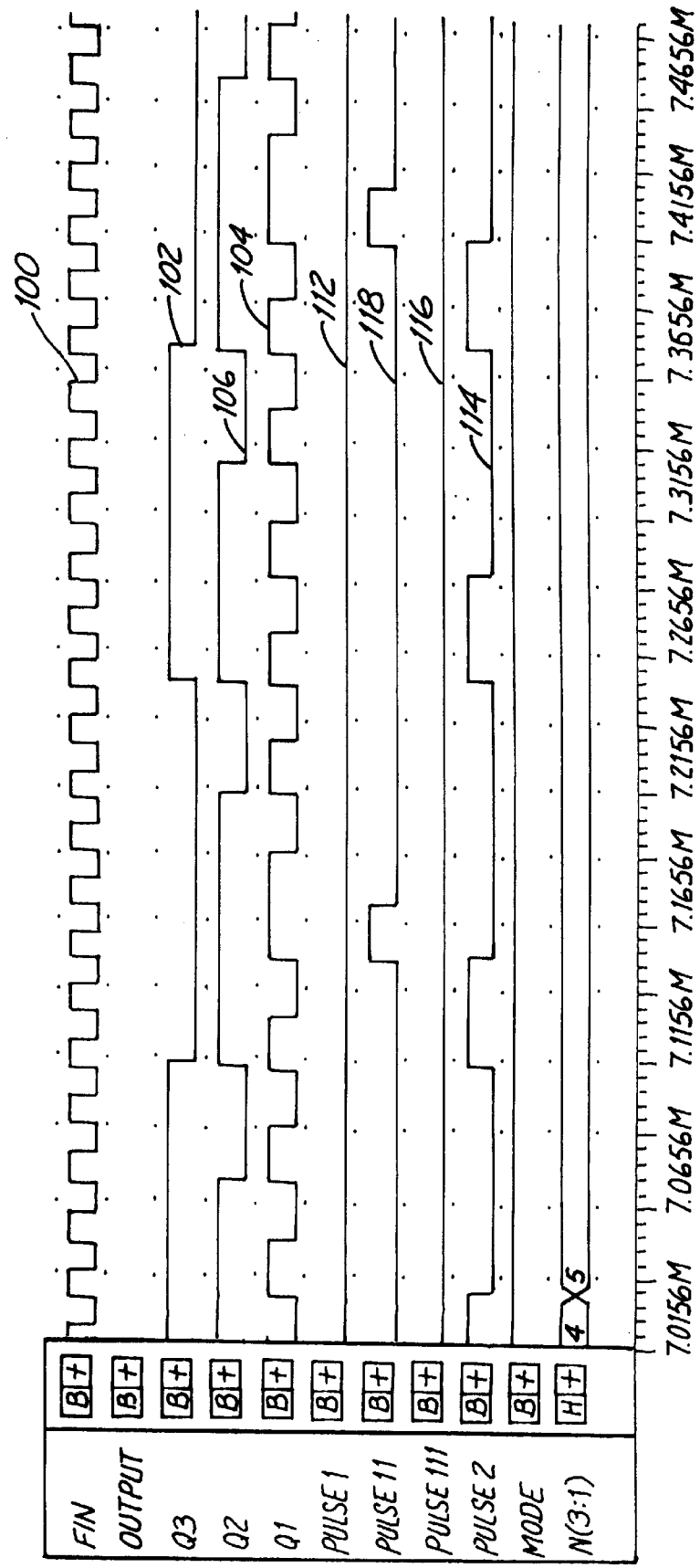

In FIG. 3E, the value of n is 5; logic highs are provided at inputs 14C and 14A. When a logic high is provided at input 14C, signal 114 provides a two-clock wide pulse on every rising edge of signal 106 as described with reference to FIG. 3B. As described with reference to FIG. 3A, signal 118 provides a pulse on every other rising edge of signal 104 only during one-half period of signal 102. In FIG. 3E, signal 118 operates to disable the transition of signal 104 from a logic high to a logic low for one clock every six rising edges of signal 104. As described with reference to FIG. 3D, signal 114 disables the transition from a logic high to a logic low of signal 106 for two-clocks every rising edge signal 106. The two-clock delay is distributed in each half period of signal 102. The combination of signals 114 and 118 on counters 26 and 28 cause signal 102 to be a logic low for seven clocks and a logic high for six clocks, thereby having a duty cycle between 46% to 54%.

Figure 3F:
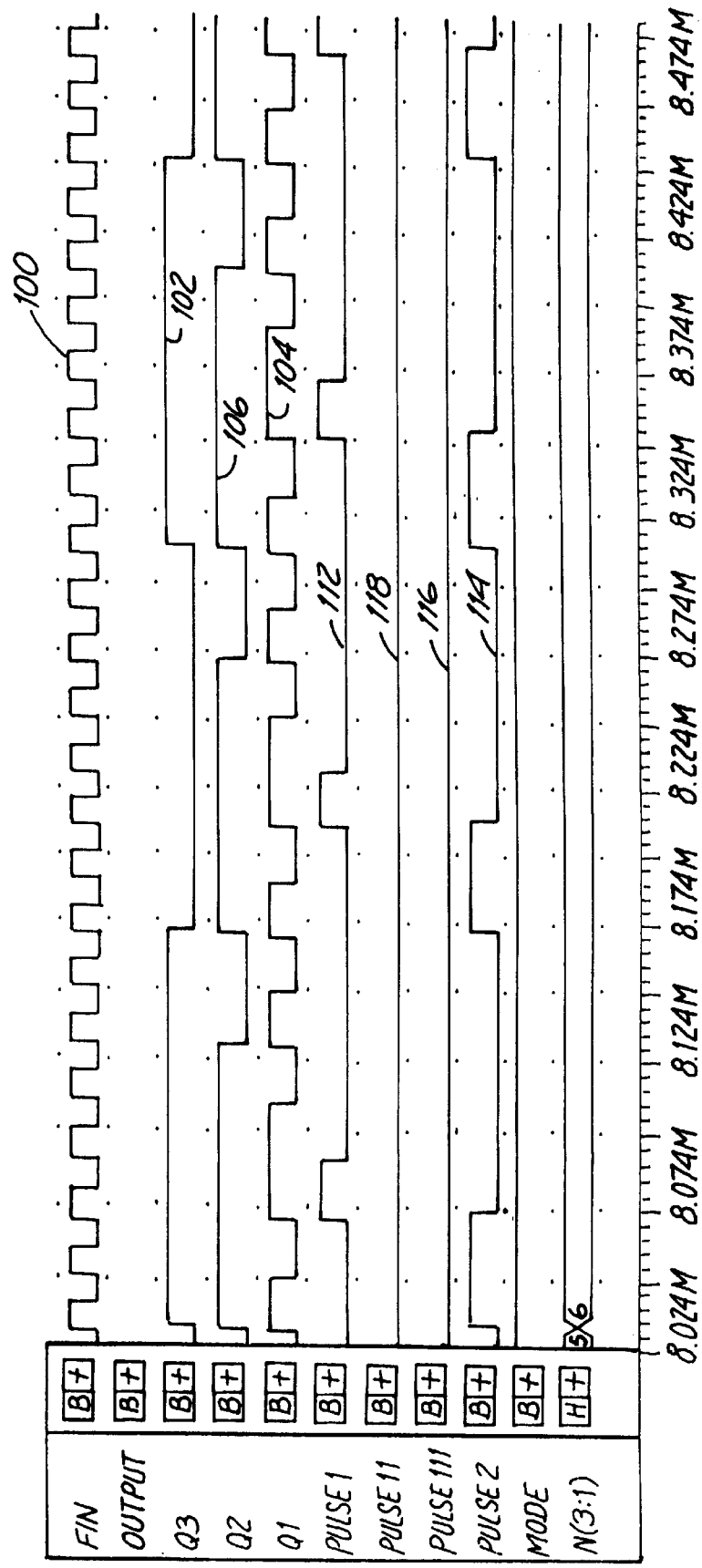

In FIG. 3F, the value of n is 6; logic highs are provided at inputs 14C and 14B. Contrary to the operation of signal 112 in FIG. 3B, signal 112 has a positive pulse on every three rising edges of signal 104. Counter 38 disables counter 36 with the signal (not shown) on line 71. The signal on line 71 is provided through logic gate 58 to delay the production of the pulse for an extra rising edge of signal 104.

Signal 114 provides a two-clock wide positive pulse on every rising edge of signal 106 as discussed with reference to FIG. 3D. Signal 112 operates to delay the transition from a logic high to a logic low of signal 104 for one clock. Signal 114 delays the transition from a logic high to a logic low of signal 106 for two-clocks. The combination of signals 112 and 114 cause a three-clock delay in the transition from a logic high to a logic low of signal 106. Therefore, signal 102 is a logic low for seven cycles of signal 100 and a logic low high for seven cycles of signal 100, thereby having a duty cycle of 50%.

Figure 3G:
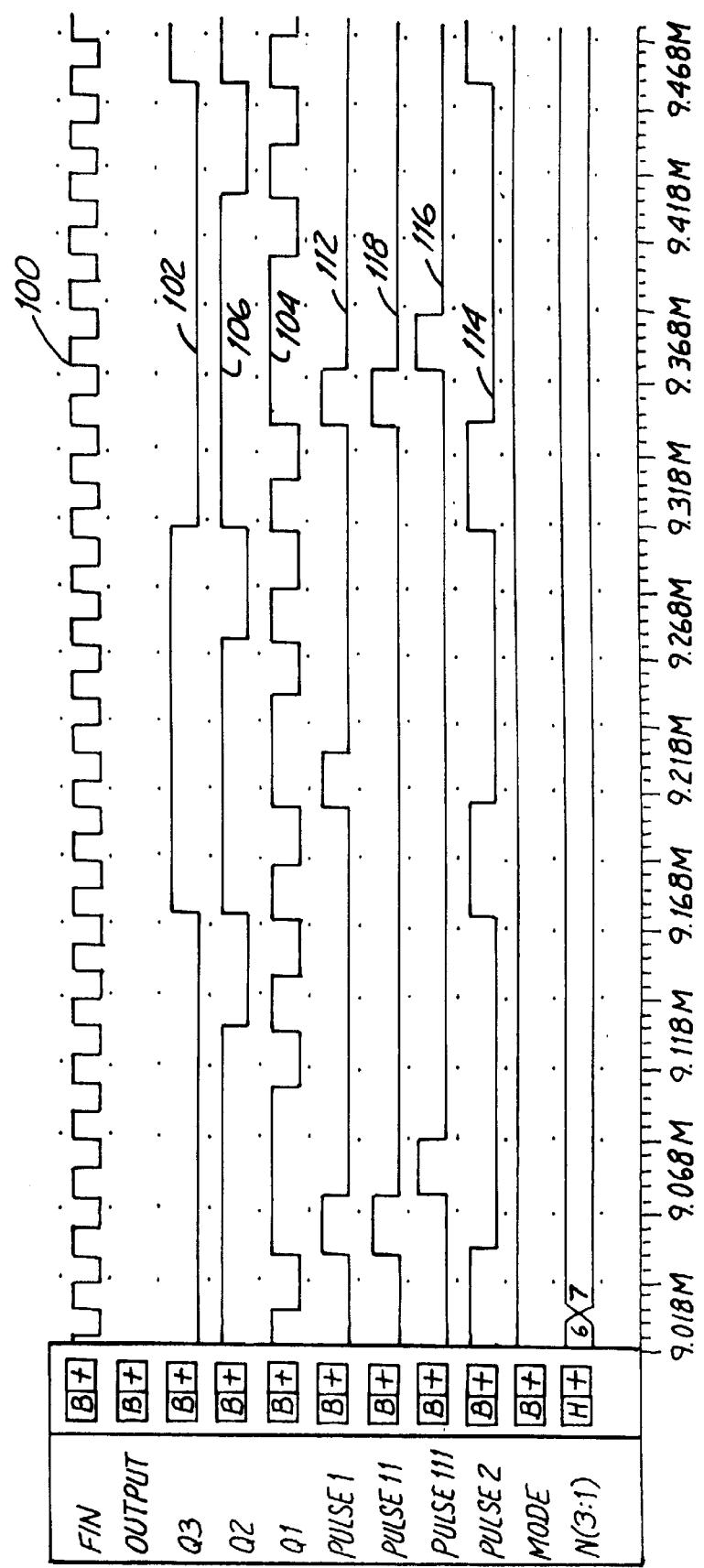

With reference to FIG. 3G, the value of n is 7; logic highs are provided at inputs 14A, 14B and 14C. As discussed with reference to FIG. 3C, the logic high at inputs 14A and 14B cause signals 112, 118 and 116 to delay the transition of signal 104 for three-clocks. As discussed with reference to FIG. 3D, the logic high at input 14C causes signal 114 to delay the transition of signal 106 for two-clocks. Therefore, the combination of signals 112, 114, 116 and 118 causes a total delay of seven clocks every cycle of signal 102. Signal 102 preferably is a logic high for seven clock cycles and a logic low for eight clock cycles and has a duty cycle between 47% and 53%.

It is understood that, while the detailed drawings, specific examples, and particular component values given describe preferred exemplary embodiments of the present invention they are for the purpose of illustration only. The apparatus and method of the invention is not limited to the precise details disclosed. For example, although D-type flip-flops are shown, other types of logic may be utilized to provide the effects of the present application. Thus, changes may be made to the details disclosed without departing from the spirit of the invention which is defined by the following claims.

What is claimed is:

1. A programmable divider for communication applications, the divider being programmable to divide an input frequency of an input signal by $(2^m+n)$, where m is an integer greater than or equal to 2 and n is an integer from 0 to $(2^m-1)$, the programmable divider comprising:

a selection input;

an array of m counters configured to receive the input signal and to provide an output signal; and a control circuit coupled to the array of counters and to the input, the control circuit receiving a selection signal at the input, the selection signal being indicative of n, the control circuit cooperating with the array so the array provides the output signal at an output frequency equal to the input frequency of the input signal divided by $(2^m+n)$, whereby the output signal has a duty cycle between 39% and 61% for all values of m and n.

2. The programmable divider of claim 1, wherein the counters are D-type flip-flops.

3. The programmable divider of claim 2, wherein the counters are arranged in a first set of m counters, the first set of m counters dividing the input frequency by m when n is zero.

4. A programmable divider for communication applications, the divider being programmable to divide an input frequency of an input signal by $(2^m+n)$, where m is an integer greater than or equal to 2 and n is an integer from 0 to $(2^m-1)$, the programmable divider comprising:

a selection input:

an array of counters configured to receive the input signal and to provide an output signal, wherein the counters are D-type flip-flops, wherein the counters are arranged in a first set of m counters, the first set of m counters dividing the input frequency by m when n is zero;

a control circuit coupled to the array of counters and to the input, the control circuit receiving a selection signal at the input, the selection signal being indicative of n, the control circuit cooperating with the array so the array provides the output signal at an output frequency equal to the input frequency of the input signal divided by $(2^m+n)$;

wherein the control circuit includes a second set of counters, the second set of counters providing a plurality of pulse signals through the control circuit, the pulse signals causing the first set of m counters to divide the input frequency by $(2^m+n)$;

whereby the output signal has a duty cycle between 39% and 61% for all values of m and n.

5. The programmable divider of claim 1, wherein the duty cycle is approximately 50% for $(2^m+n)$ being an even number and the duty cycle being within one count of approximately 50% for $(2^m+n)$ being an odd number.

6. The programmable divider of claim 1, wherein the control circuit includes a plurality of logic gates.

7. The programmable divider of claim 2, wherein the logic gates are OR gates.

8. A programmable divider for communication applications, the divider being programmable to divide an input frequency of an input signal by $(2^m+n)$, where m is an integer greater than or equal to 2 and n is an integer from 0 to $(2^m-1)$, the programmable divider comprising:

a selection input;

an array of counters configured to receive the input signal and to provide an output signal, wherein the counters are D-type flip-flops;

a control circuit coupled to the array of counters and to the input, the control circuit receiving a selection signal at the selection input, the selection signal being indicative of n, the control circuit cooperating with the array so the array provides the output signal at an output frequency equal to the input frequency of the input signal divided by $(2^m+n)$, wherein the counters have a data input and a data output, wherein the control circuit includes a plurality of OR gates, the OR gates each having an input coupled to the selection input and an output coupled to the data input of at least one of the counters, whereby the output signal has a duty cycle between 39% and 61% for all values of m and n.

9. A programmable divider, comprising:

a selection input for receiving a value of n;

a first counter circuit configured to receive the input signal and to provide an output signal, the first counter circuit including m counters each having an output; and a second counter circuit configured to selectively and temporarily disable a transition of at least one output of the m counters in response to the value of n, the first counter circuit providing the output signal at an output frequency equal to the input frequency of the input signal divided by $(2^m+n)$, where m is an integer greater than or equal to 2 and n is an integer from 0 to $(2^m-1)$, whereby the output signal has a duty cycle between 39% and 61% for all values of m and n.

10. A programmable divider, comprising:

a selection input for receiving a value of n;

a first counter circuit configured to receive the input signal and to provide an output signal, the first counter circuit including m counters each having an output; and a second counter circuit configured to selectively and temporarily disable a transition of at least one output of the m counters in response to the value of n, the first counter circuit providing the output signal at an output frequency equal to the input frequency of the input signal divided by $(2^m+n)$, where m is an integer greater than or equal to 2 and n is an integer from 0 to $(2^m-1)$, whereby the output signal has a duty cycle between 39% and 61% for all values of m and n;

wherein m equals three and the first counter circuit includes a first counter, a second counter, and a third counter, the first counter having a first clock input and a first output, the first clock input receiving the input signal, the second counter having a second clock input and a second output, the second clock input being coupled to the first output, and the third counter having a third clock input and a third output, the third clock input being coupled to the second output.

11. The programmable divider of claim 10, wherein the third output provides the output signal.

12. The programmable divider of claim 11, wherein the second counter circuit includes a fourth counter, the fourth counter disabling the transition of the first output of the first counter in response to the value of n being 2.

13. The programmable divider of claim 12, wherein the fourth counter disables the transition for one cycle of the input signal once every five cycles of the input signal in response to the value of n being 2.

14. The programmable divider of claim 13, wherein the second counter circuit includes a fifth counter and a sixth counter, the fourth counter, the fifth counter, and the sixth counter disabling the transition of the first output of the first counter twice during the first six cycles of the input signal and once during the next five cycles of the input signal in response to the value of n being 3.

15. The programmable divider of claim 14, wherein the second counter circuit includes a seventh counter, the seventh counter disabling the transition of the second output of the second counter in response to the value of n being 4, the seventh counter disabling the transition of the second output once every two cycles of a signal at the first output.

16. A programmable prescaler responsive to a value n, the programmable prescaler dividing an input frequency of an input signal by $(2^m+n)$, wherein m is an integer greater than or equal to 2 and n is an integer from 0 to $(2^m-1)$, the programmable prescaler comprising:

a first means for receiving the input signal and providing an output signal at an output frequency equal to the input frequency of the input signal divided by $(2^m+n)$, the first means including m counters; and a second means for receiving the value n and cooperating with the first means to cause the output signal to have an output frequency equal to the input frequency of the input signal divided by $(2^m+n)$ and the output signal has a duty cycle between 39% and 61% for all values of m and n.

17. The programmable prescaler of claim 16, wherein the second means includes logic means coupled to receive a plurality of logic signals indicative of n.

18. The programmable prescaler of claim 16, wherein the first means includes m flip-flops.

19. The programmable prescaler of claim 18, wherein m is three.

20. The programmable prescaler of claim 16, wherein the prescaler is utilized in a radio frequency mixing application.

21. A programmable divider, comprising:

a selection input for receiving a value of n;

a first counter circuit configured to receive the input signal and to provide an output signal, the first counter circuit including first counters, each counter having an output; and a second counter circuit configured to selectively and temporarily disable a transition of at least one output of the first counters in response to the value of n, the second counter circuit being coupled to each output of the first counters, the first counter circuit providing the output signal at an output frequency equal to the input frequency of the input signal divided by $(2^m+n)$, where m is an integer greater than or equal to 2 and n is an integer from 0 to $(2^m-1)$, whereby the output signal has a duty cycle between 39% and 61% for all values of m and n.

* * * * *